(12) United States Patent
Coston et al.

(10) Patent No.: US 7,006,295 B2
(45) Date of Patent: Feb. 28, 2006

(54) ILLUMINATION SYSTEM AND METHOD FOR EFFICIENTLY ILLUMINATING A PATTERN GENERATOR

(75) Inventors: Scott Coston, New Milford, CT (US); Wenceslao A. Cebuhar, Norwalk, CT (US); Jason D. Hintersteiner, Bethel, CT (US)

(73) Assignee: ASML Holding N.V., Veldhoven (NL)

( * ) Notice: Subject to any disclaimer, the term of this patent is extended or adjusted under 35 U.S.C. 154(b) by 21 days.

(21) Appl. No.: 10/808,436

(22) Filed: Mar. 25, 2004

(65) Prior Publication Data
US 2004/0179270 A1    Sep. 16, 2004

Related U.S. Application Data

(63) Continuation-in-part of application No. 10/270,556, filed on Oct. 16, 2002, now Pat. No. 6,775,069.

(60) Provisional application No. 60/329,758, filed on Oct. 18, 2001.

(51) Int. Cl.
*G02B 27/10* (2006.01)

(52) U.S. Cl. ............... 359/619; 359/621; 359/628; 362/257; 362/268

(58) Field of Classification Search ............... 359/619, 359/621, 622, 624, 628; 362/257, 268, 317, 362/319
See application file for complete search history.

(56) References Cited

U.S. PATENT DOCUMENTS

| | | | |
|---|---|---|---|
| 4,918,583 A * | 4/1990 | Kudo et al. ............... 366/268 |
| 4,931,830 A | 6/1990 | Suwa et al. ............... 355/71 |
| 5,343,489 A | 8/1994 | Wangler ................... 372/93 |
| 5,383,000 A | 1/1995 | Michaloski et al. ......... 355/67 |
| 5,623,479 A | 4/1997 | Takahashi ................. 369/53.15 |
| 5,631,721 A | 5/1997 | Stanton et al. ............ 355/71 |

(Continued)

FOREIGN PATENT DOCUMENTS

DE    44 21 053 A1    12/1995

(Continued)

OTHER PUBLICATIONS

English Abstract for European Patent Publication No. EP1079227, 1 page, data supplied from the espacenet database.

(Continued)

*Primary Examiner*—Huy Mai
(74) *Attorney, Agent, or Firm*—Sterne, Kessler, Goldstein & Fox P.L.L.C.

(57) ABSTRACT

An illumination method and system use a light source and illumination optics to illuminate a pattern generator. The illumination optics can include at least two devices. For example, if first and second diffractive and/or refractive devices are used, one can be a pupil defining element (PDE) and one can be a field defining element (FDE). In another example, a third diffractive or refractive element can be used to make light entering the illumination system uniform. When only two are used, the PDE forms one or more light beams having a defined profile. The FDE directs the one or more light beams having the defined profile, such that each directed beam substantially corresponds in size and shape to a desired illumination area(s) on the pattern generator. The directed beams are directed to impinge substantially only on the desired illumination area(s). Thus, using the PDE and the FDE increases optical efficiency of light impinging on the pattern generator and substantially reduces or eliminates stray light caused by light impinging on undesired areas of the pattern generator.

23 Claims, 8 Drawing Sheets

U.S. PATENT DOCUMENTS

| | | | |
|---|---|---|---|
| 5,675,401 A | 10/1997 | Wangler et al. ................ 355/67 |
| 5,844,727 A * | 12/1998 | Partlo .......................... 359/710 |
| 6,243,206 B1 | 6/2001 | Wangler ..................... 359/663 |
| 6,285,443 B1 | 9/2001 | Wangler et al. ................ 355/67 |
| 6,307,682 B1 | 10/2001 | Hoffman et al. ............. 359/663 |
| 6,563,567 B1 | 5/2003 | Komatsuda et al. ........... 355/71 |
| 6,583,937 B1 | 6/2003 | Wangler et al. .............. 359/624 |
| 6,631,721 B1 | 10/2003 | Salter et al. ........... 128/207.14 |
| 6,775,069 B1 * | 8/2004 | Oskotsky et al. ............ 359/624 |
| 6,813,003 B1 | 11/2004 | Oskotsky et al. .............. 355/67 |
| 2001/0055107 A1 | 12/2001 | Tsuji ............................ 355/67 |
| 2002/0085276 A1 | 7/2002 | Tanitsu et al. ................ 359/432 |
| 2002/0171944 A1 | 11/2002 | Suenaga et al. ............. 359/689 |
| 2003/0025890 A1 | 2/2003 | Nishinaga .................... 355/53 |
| 2003/0076679 A1 | 4/2003 | Oskotsky et al. ........... 362/268 |
| 2003/0160949 A1 | 8/2003 | Komatsuda et al. ........... 355/71 |
| 2003/0227609 A1 | 12/2003 | Oskotsky et al. .............. 355/67 |
| 2004/0051953 A1 * | 3/2004 | Mizouchi .................... 359/619 |
| 2004/0263821 A1 | 12/2004 | Oskotsky et al. .............. 355/67 |
| 2005/0007677 A1 | 1/2005 | Coston et al. .............. 359/663 |

FOREIGN PATENT DOCUMENTS

| | | |
|---|---|---|
| EP | 0 747 772 A1 | 12/1996 |
| EP | 1 014 196 A2 | 6/2000 |
| EP | 1 079 227 A1 | 2/2001 |
| EP | 1 170 635 A2 | 1/2002 |
| EP | 1 180 726 A2 | 2/2002 |
| EP | 1 211 561 A2 | 6/2002 |
| EP | 1 248 151 A2 | 10/2002 |
| EP | 1 291 720 A2 | 3/2003 |
| EP | 1 372 034 A2 | 12/2003 |
| WO | WO 01/61411 A1 | 8/2001 |

OTHER PUBLICATIONS

Search Report from European Paent Appl. No. EP 03013136.1-226-, 4 pages, issued Apr. 28, 2005.

Search Report from Singapore Patent Appl. No. SG200304444-3, 6 pages, mailing date Jan. 6, 2004.

* cited by examiner

ILLUMINATION SYSTEM AND METHOD FOR EFFICIENTLY ILLUMINATING A PATTERN GENERATOR

CROSS REFERENCE TO RELATED APPLICATIONS

This application is a continuation-in-part of U.S. Ser. No. 10/270,556, filed Oct. 16, 2002 now U.S. Pat. No. 6,775,069 entitled "Advanced Illumination System for Use in Microlithogrpahy," (published as U.S. Patent Application Publication No. 2003/0076679 A1 on Apr. 24, 2003), which claims benefit under 35 U.S.C. 119(e) to U.S. Provisional Application No. 60/329,758, filed Oct. 18, 2001, which are both incorporated herein by reference in their entireties.

This application is also a continuation-in-part of U.S. Ser. No. 10/166,062, to Oskotsky et al., entitled "Advanced Illumination System for Use in Microlithography," filed Jun. 11, 2002 (now U.S. Patent Application Publication No. 2003/0227609 A1), which is incorporated by reference herein in its entirety.

This application is related to U.S. Ser. No. 10/812,978, filed Mar. 31, 2004 (1857.0700003), which is incorporated by reference herein in its entirety.

BACKGROUND OF THE INVENTION

1. Field of the Invention

The present invention is related to an illuminating system and method for illuminating a pattern generator, and more particularly for illuminating a pattern generator in a lithography system.

2. Background Art

Pattern generators are used in many different environments to pattern objects or project patterns using light, for example, in lithography systems, televisions, biomedical systems, biotechnology systems, etc. Typically, reticles (or masks), spatial light modulators (SLMs) or contrast devices (hereinafter, both are referred to as SLMs), such as digital mirror devices (DMDs), liquid crystal displays (LCDs), grating light valves (GLVs), or the like, or any other elements that include a transmissive and/or reflective pattern can be used as pattern generators.

SLMs can include an active area having an n×m (wherein n and m are integers greater than 1) array of active devices (or pixels) (e.g., an array of mirrors on the DMD, an array of gratings on a GLV, or an array of reflective/transmissive devices on the LCD). Each active device is individually controlled to move the active devices between ON and OFF through one or more discrete states. For example, if the active devices are mirrors on the DMD, each of the mirrors is individually controlled to rotate or tilt the mirror to either binary or multiple positions. As another example, if the active devices are strips in a GLV, sets of strips can be bent or straight to allow reflection or diffraction of incoming light beams.

It is to be appreciated that controlling the active devices in active areas so that they are partially or fully ON or OFF is well know in the art, and not fully described here for brevity. Typically, a predetermined and previously stored algorithm based on a desired exposure pattern is used to turn ON (or partially ON) and OFF the active devices, as is known in the relevant arts.

FIGS. 1, 2, and 3 show conventional systems 100, 200, and 300, respectively, for illuminating a pattern generator, so that patterned light is formed and directed from the pattern generator. As is known, the illumination optics, and optional pattern generator optics, can include one or more optical elements (e.g., lenses, mirrors, etc.). In one arrangement, the illumination optics can include the pattern generator optics. In another arrangement, the pattern generator optics can be a separate element. A projection system would normally focus patterned light from the pattern generator onto a substrate.

FIG. 4 shows a convention illumination field 400 that can result from systems 100, 200, and/or 300 for pattern generator 402 having desired illumination areas 404. Each illumination area can be either an active area of an SLM or a desired portion of a pattern on a reticle. As discussed above, each active area will include the active devices. As can be seen, illumination field 400 is so large that it not only impinges on desired illumination areas 404, but is larger than pattern generator 402. Thus, a substantial amount, maybe up to about 80–90%, of the light may be wasted (i.e., not used during operation of system 100, 200, and/or 300) because that amount of light does not impinge on desired illumination areas 404.

One use for the pattern generator, or an array thereof, is in maskless lithography. Lithography is a process used to create features on the surface of a substrate. Such substrates can include those used in the manufacture of flat panel displays (e.g., liquid crystal displays), circuit boards, various integrated circuits, and the like. A frequently used substrate for such applications is a semiconductor wafer or flat panel display glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image (e.g., a pattern) formed by the pattern generator, or array thereof. The image is projected onto the surface of the wafer by exposure optics located within a lithography apparatus. While exposure optics are used in the case of photolithography, a different type of exposure apparatus can be used depending on the particular application. For example, an excimer laser, x-ray, ion, electron, or photon lithography can each require a different exposure apparatus, as is known to those skilled in the art. The particular example of photolithography is discussed here for illustrative purposes only.

The projected image produces changes in the characteristics of a layer (e.g., photoresist) deposited on the surface of the wafer. These changes correspond to features in the image projected onto the wafer during exposure. Subsequent to exposure, the layer can be etched to produce a patterned layer. The pattern corresponds to the features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time with the image formed by the pattern generator, individual fields are scanned onto the wafer one at a time. This is accomplished by moving the wafer and controlling active devices on the pattern generator, such that the imaging slot is moved across the field during the scan. The wafer stage must then be stepped between field exposures to allow multiple copies of the pattern formed by the active devices on the pattern generator to be exposed over the wafer surface. In this manner, the quality of the image projected onto the wafer is maximized.

Desired illumination areas on a pattern of a reticle (or mask) or the active area of the SLM are usually substantially smaller than a size of a surface incorporating the desired illumination areas of the pattern or the active area. For example, in an SLM, an active area may only be 10–20% of the SLM surface, with the remaining surface area of the SLM being an inactive area, which can include packaging, circuitry, and the like. Thus, a substantial amount of the light directed to the pattern generator may not impinge on the desired illumination area of the pattern or the active area, but instead impinges on undesired areas of the pattern or the inactive areas, which can result in stray light and/or wasted light. Some of the stray light can reach the surface of the substrate. The stray light reaching the surface of the substrate can cause errors in devices being fabricated on the substrate.

Therefore, what is needed is a system and method that increases optical efficiency by directing light such that it substantially impinges on desired illumination areas of a pattern generator and that reduces or substantially eliminates stray light caused from light impinging on undesired areas of the pattern generator.

BRIEF SUMMARY OF THE INVENTION

An embodiment of the present invention provides a system that substantially increases optical efficiency and substantially reduces or eliminates the generation of stray light generated when illumination light impinges on undesired areas of a pattern generator. The system includes a light source, a pupil defining element (PDE), a field defining element (FDE), an optical system, and the pattern generator. The PDE and FDE can be diffractive or refractive devices. Light emitted from the light source is transmitted through the PDE and FDE to form shaped and directed beams that are directed onto one or more desired illumination areas of the pattern generator and are directed substantially away from undesired areas of the pattern generator.

Other embodiments of the present invention include a method that substantially increases optical efficiency and substantially reduces or eliminates the generation of stray light generated when illumination light interacts with a pattern generator (e.g., a reflective or transmissive reticle or SLM). The method includes transmitting light through a PDE and a FDE to form beams of light, directing the beams of light using an optical system towards the pattern generator, and substantially illuminating only the desired illumination areas of the pattern generator and substantially no undesired areas of the pattern generator, based on the transmitting and directing steps.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1, 2, and 3 show high-level block diagrams of systems for illuminating pattern generators.

Figure 1:
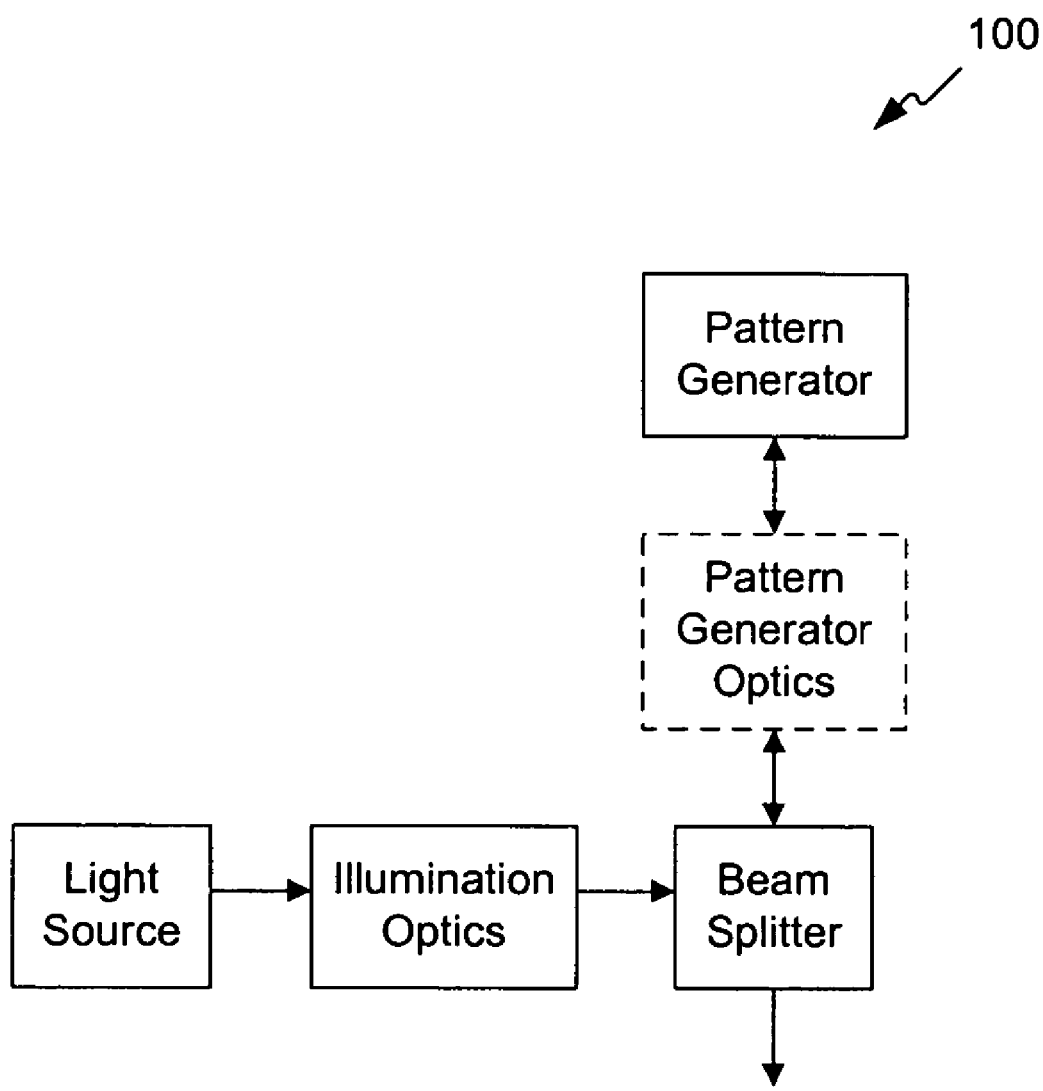

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

An embodiment of the present invention provides an illumination system having a light source and illumination optics. The illumination system is used to illuminate a pattern generator. The illumination optics include at least two devices. For example, if first and second diffractive and/or refractive devices are used, one can be a pupil defining element (PDE) and one can be a field defining element (FDE). In another example, a third diffractive or refractive element can be used to make light entering the illumination system uniform. When only two devices are used, the PDE forms one or more light beams having a defined profile. The FDE directs the one or more light beams having the defined profile, such that each directed beam substantially corresponds in size and shape to a desired illumination area(s) on the pattern generator. The directed beams are directed to impinge substantially only on the desired illumination area(s). Thus, using the PDE and the FDE increases optical efficiency of light impinging on the pattern generator and substantially reduces or eliminates stray light caused by light impinging on undesired areas of the pattern generator.

For the sake of brevity, a complete description of the operation and functionality of an SLM device (e.g., a DMD, a GLV, an LCD, etc.) being used as the pattern generator is not described herein. For example, it is to be appreciated that controlling the active devices in active areas so that they are partially or fully ON or OFF is well know in the art, and not fully described here for brevity. Typically, a predetermined and previously stored algorithm based on a desired exposure pattern is used to turn ON (or partially ON) and OFF the active devices, as is known in the relevant arts.

It is also to be appreciated that illumination optics and pattern generator optics can include one or more optical devices, for example lenses, mirrors, and the like, or other light manipulating devices, as would be known to a person of ordinary skill in the art upon reading this description.

Illumination Optics

Figure 5:
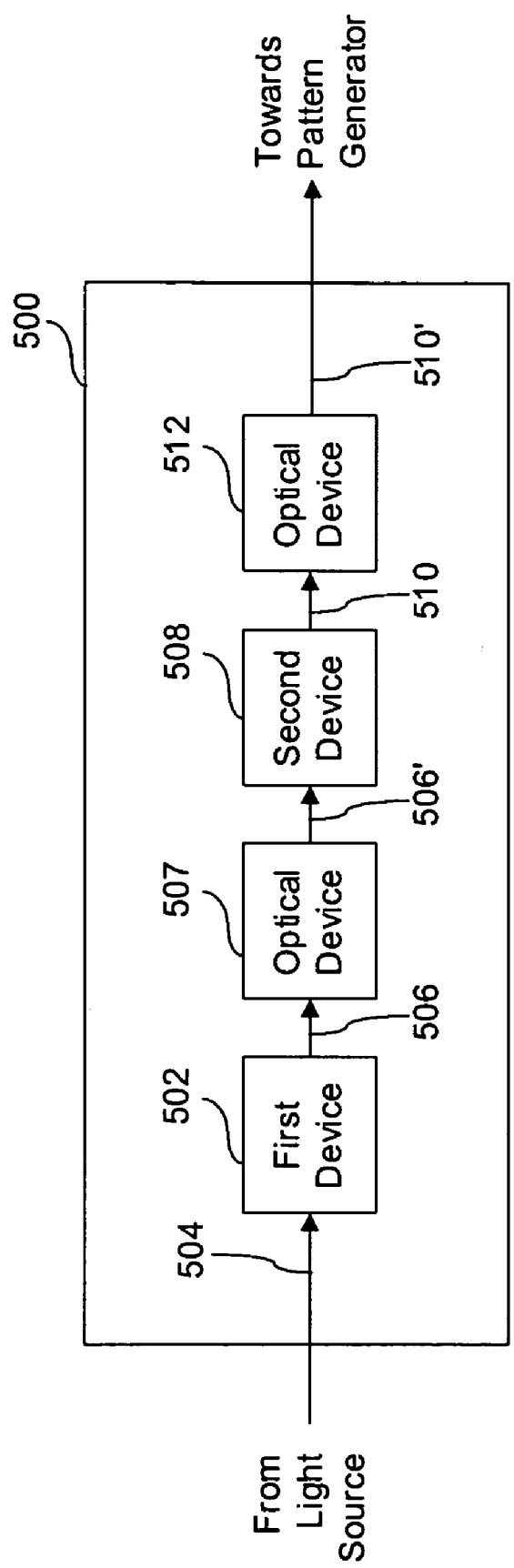
FIG. 5 shows an arrangement of illumination optics according to an embodiment of the present invention.

FIG. 5 shows an arrangement of elements in illumination optics 500 according to an embodiment of the present invention. The illumination optics can be placed in any of systems 100, 200, or 300, or any other system used to illuminate a pattern generator. The illumination optics 500 can be used to form shaped and directed beams, such that substantially only desired illumination areas (e.g., pattern areas of a reticle or active areas of an SLM device) are illuminated. This can be used to increase optical efficiency and decrease stray light.

Figure 2:
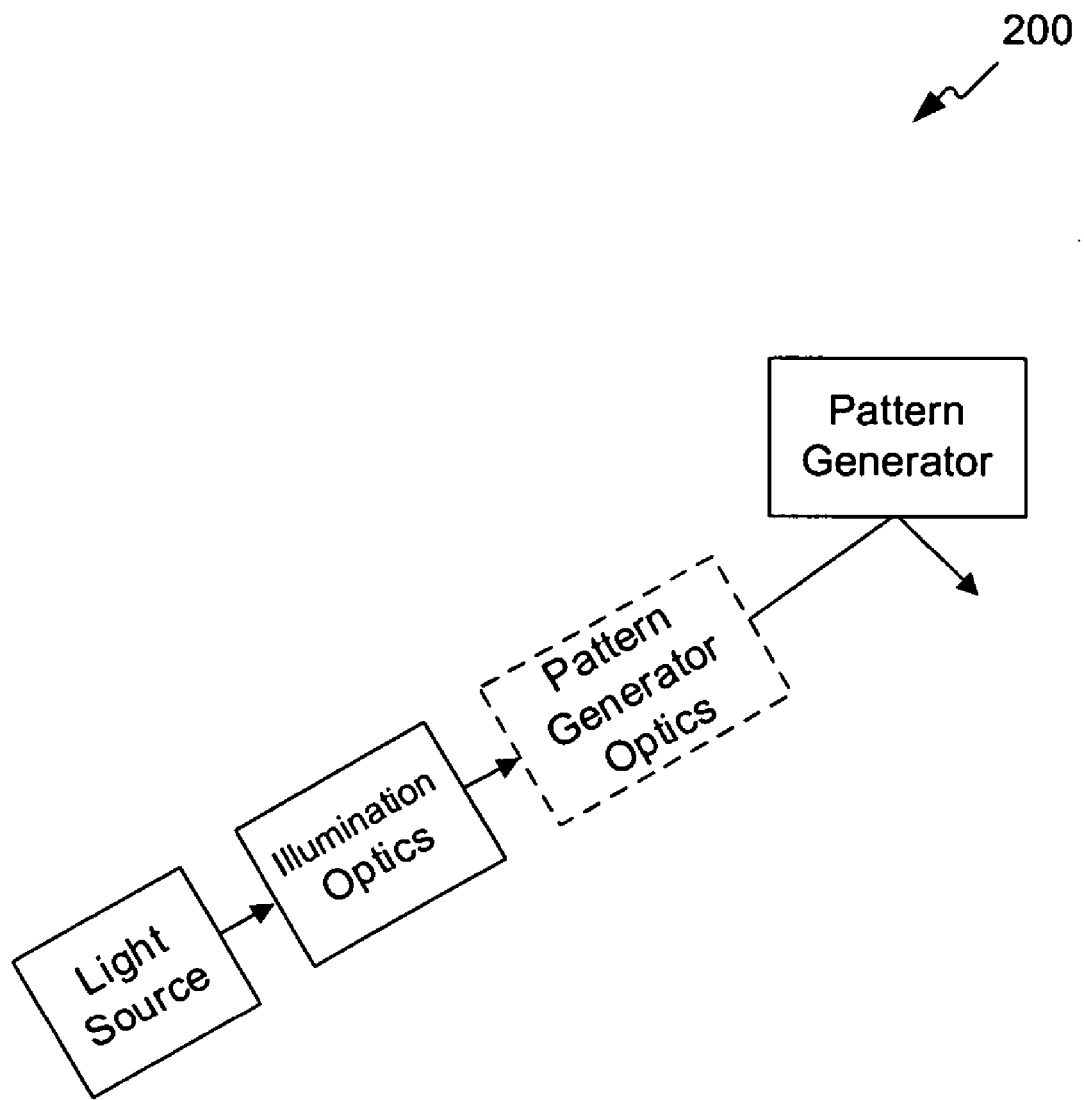
Figure 3:
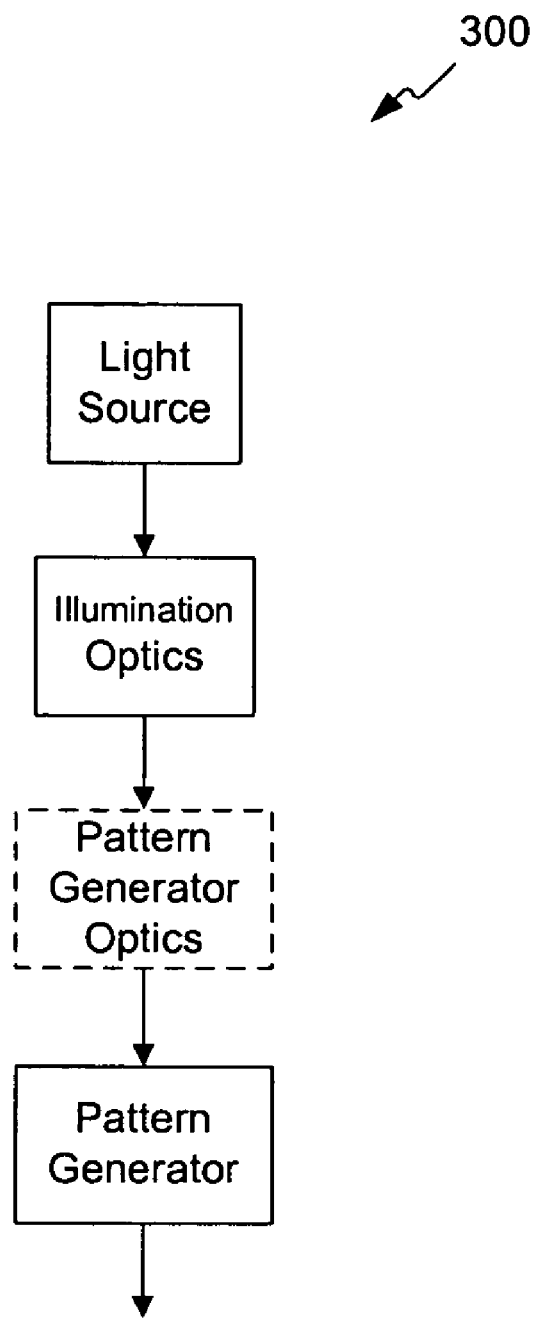
Figure 4:
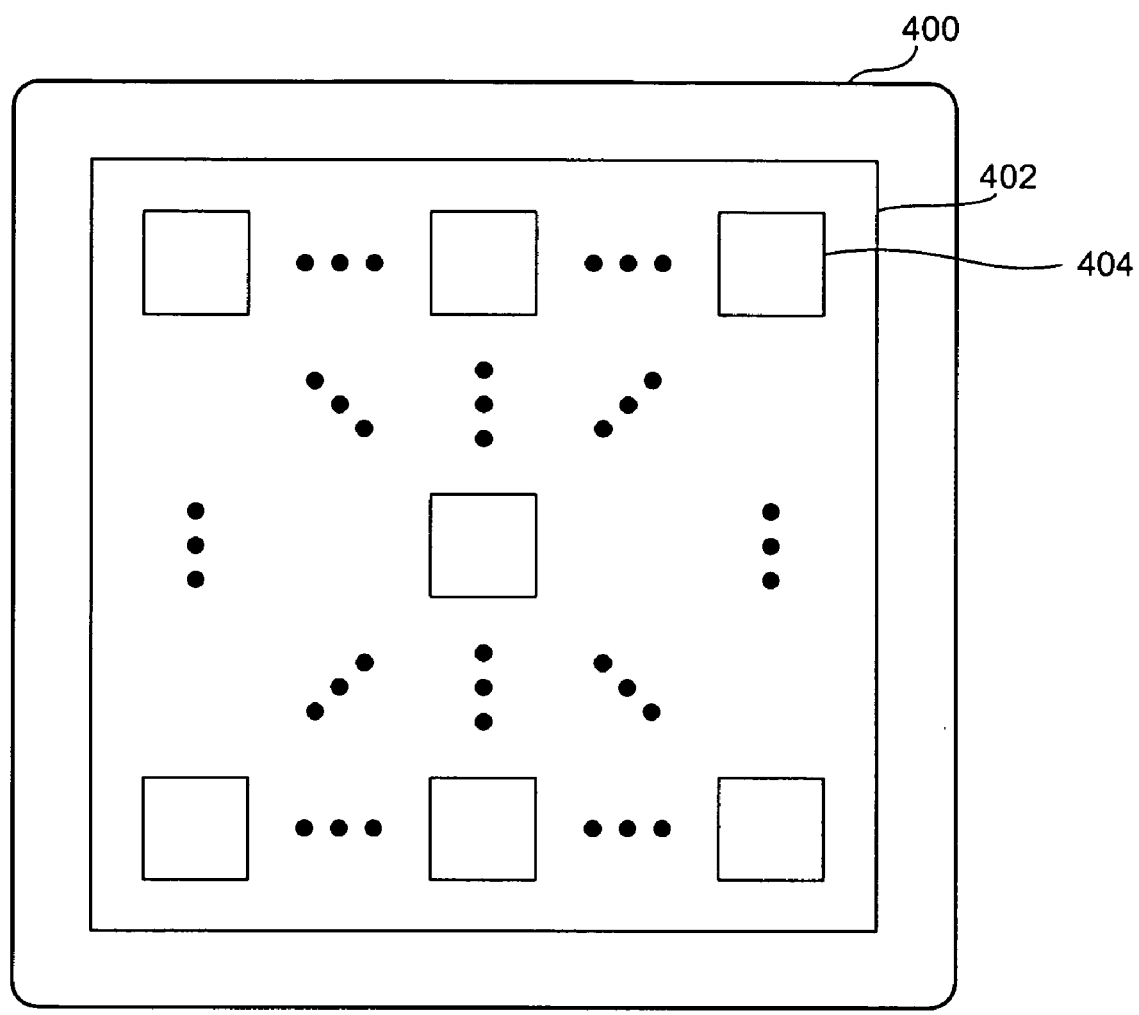
FIG. 4 shows an array of pattern generator areas that need to be illuminated.

A first device 502 (e.g., a pupil defining element (PDE)) is positioned in a pupil plane of illumination optics 500 and receives a light beam 504 from a light source (not shown, but similar to those shown in FIGS. 1, 2, or 3).

PDE 502 can comprise a refractive (e.g., lens array, etc.) or diffractive (e.g., diffraction grating, etc.) optical element. PDE 502 can be used to shape light beam 504 as it is transmitted therethrough. For example, PDE 502 can be used to define a light beam profile for one or more light beams 506. For example, PDE 502 can form conventional, dipole, quadrapole, etc. profiles for beam(s) 506.

An optical device 507 (e.g., one or more optical elements) directs beam(s) 506' onto a second device 508 (e.g., a field defining element (FDE)). FDE 508 can be a refractive (e.g., a lens array, etc.) or diffractive (e.g., diffraction grating, etc.) optical element, which is positioned at a field plane of illumination optics 500. FDE 508 can be used to form one or more light beams 510 that maintain a shape of beam(s) 506', but are directed to specific areas of a pattern generator (not shown) via optical device 512.

Although PDE 502 and FDE 508 are shown in a particular order in illumination optics 500, it is to be appreciated their order in the illumination path can be reversed, as is contemplated within the scope of the present invention.

It is to be appreciated that first and second diffractive devices 502 and 508, respectively, can include more than one diffractive or refractive optical element. For example, in one embodiment using diffractive optical elements, first diffractive device 502 can also include a uniform beam profiling (UBP) diffractive optical element positioned before the PDE. In this embodiment, the UBP generates a uniform beam profile from light beam 504.

Another exemplary optical system is shown in FIG. 2a of U.S. Ser. No. 10/270,556 (U.S. Patent Application Publication 2003/0076679 A1 ("the '679 PPA)), which is incorporated by reference herein in its entirety. The '679 PPA shows an optical system 200 that can be used to shape and direct light.

System 200 in FIG. 2a of the '679 PPA includes a first diffractive array or field array 210, a second diffractive array or pupil array 212, and a condenser system 220 placed in an optical path along an optical axis 209 between first diffractive array 210 and second diffractive array 212. First diffractive array 210 can be used to provide spatial and temporal coherence treatment for conditioned light 103 entering illumination system 200. Second diffractive array 212 can act as a pupil and can change a magnitude of a light. Also, FIGS. 5a, 5b, 6a, and 6b of the '679 PPA, and the description thereof, show exemplary diffraction devices that can be used for first and second diffractive arrays 210 and 212.

Illumination optics 500 (or 200 in the '679 PPA) can be configured so that PDE 502 and/or FDE 508 (or PDE 210 and FDE 212 in the '670 PPA) are easily replaced (swapped) by other PDEs and FDEs. This can allow for illumination optics 500 (or system 200 in the '679 PPA) to be flexible enough to produce any desired number, position, and/or size of directed beams 510, as is appropriate for a particular desired illumination area on the pattern generator. For example, the pattern generator can include a plurality of SLMs and only a predetermined set of the plurality of SLMs form the desired illumination areas. In this case, a specific PDE 502 and FDE 508 can be inserted into illumination optics 500 to produce the desired pattern. As another example, the pattern generator can include one or more SLMs each having varying sized active devices and/or active areas. In this case, a specific PDE 502 and FDE 508 can be inserted into illumination optics 500 to produce the desired pattern. In other examples, the interchangeability of PDEs and FDEs can allow a system including illumination optics 500 to switch between high and low resolution modes, to adjust throughput requirements, or the like.

Exemplary Light Path through the Illumination Optics

Figure 6:
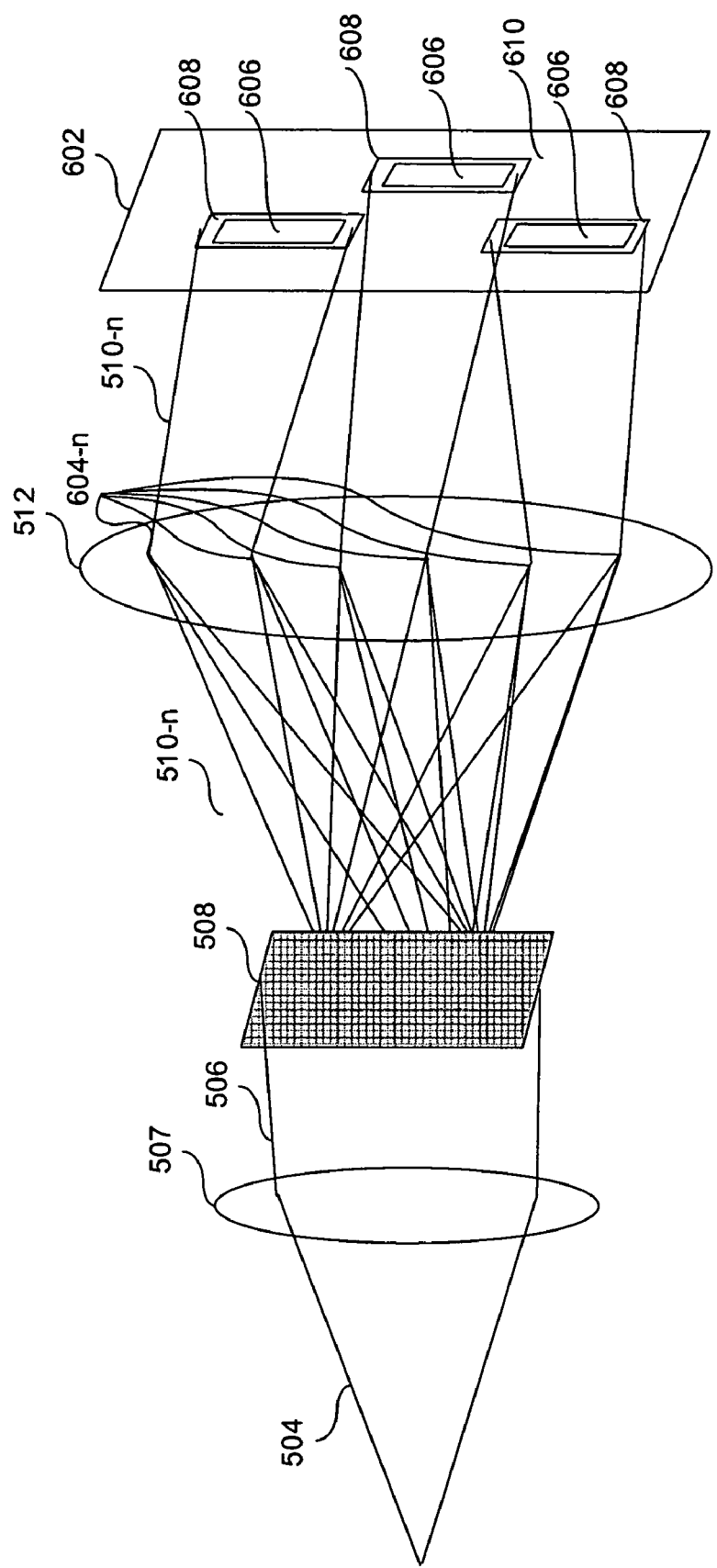
FIG. 6 shows a light path from a diffraction or refraction device to a pattern generator according to an embodiment of the present invention.

FIG. 6 shows a portion of a light path through illumination optics 500 of FIG. 5 according to an embodiment of the present invention. It is to be appreciated a similar light path can be formed through system 200 of the '679 PPA.

Light beam 506' impinges FDE 508 to form beams 510-n. It is to be appreciated that a number of beams 510 in FIG. 6 is for illustrative purposes. If pattern generator 602 included more or less desired illumination areas 606 then the number of beams 510 would respectively reflect that number. If FDE 508 is a diffraction grating, beams 510 can be desired orders of diffracted beams.

Beams 510 impinge on optical device 512 at areas 604-n. Directed beams 510'-n exit optical device 512 and form an illumination spots 608 on respective desired illumination areas 606 of pattern generator 602. Therefore, through the use of illumination optics 500, light 502 from the light source is shaped and directed so that each illumination spot 608 covers only a small portion of a surface 610 and all of desired illumination areas 606, which is best shown in FIG. 7.

Figure 7:
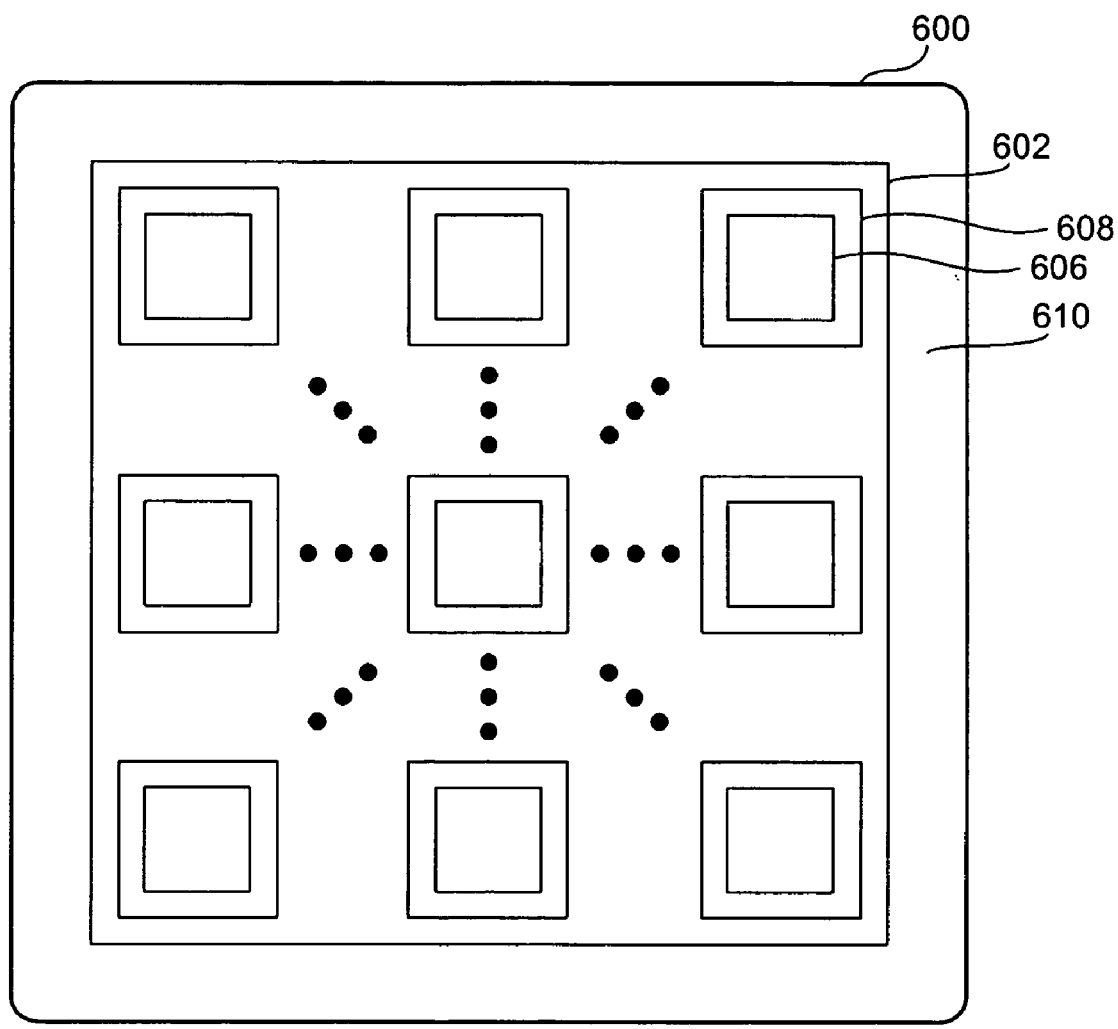
FIG. 7 shows an illumination pattern on a pattern generator according to an embodiment of the present invention.

FIG. 7 shows illumination areas 608. Using FDE 508 and optic 512, illumination spots 608 impinge substantially only on desired illumination areas 606, while only covering a small (desired) portion of surface 610. In the example using an SLM for pattern generator 602, using illumination optics 500 of the present invention can increase illumination efficiency up to around the 80–90% range.

Therefore, through use of illumination optics 500 (or system 200 in the '679 PPA) an increase in an amount of light intensity at each desired illumination area 606 can result without a need to increase the power of the light source. Illumination optics 500 (or system 200 in the '679 PPA) can further decrease or substantially eliminate stray light from surface 610, which decreases or substantially eliminates errors on fabricated devices caused by the stray light.

It is to be appreciated that, although illumination spots 608 are shown as certain shapes, the illumination spots 608 can be any shape. The shape, as discussed above, can be based on FDE 508.

Exemplary Application of the Illumination System

One exemplary application that can use illumination system 500 (or system 200 in the '679 PPA) and pattern generator 602 can be a maskless lithography system 800, as described below. However, it is to be appreciated that other systems, such as those described above, can also employ illumination system 500 to illuminate pattern generator 602.

Figure 8:
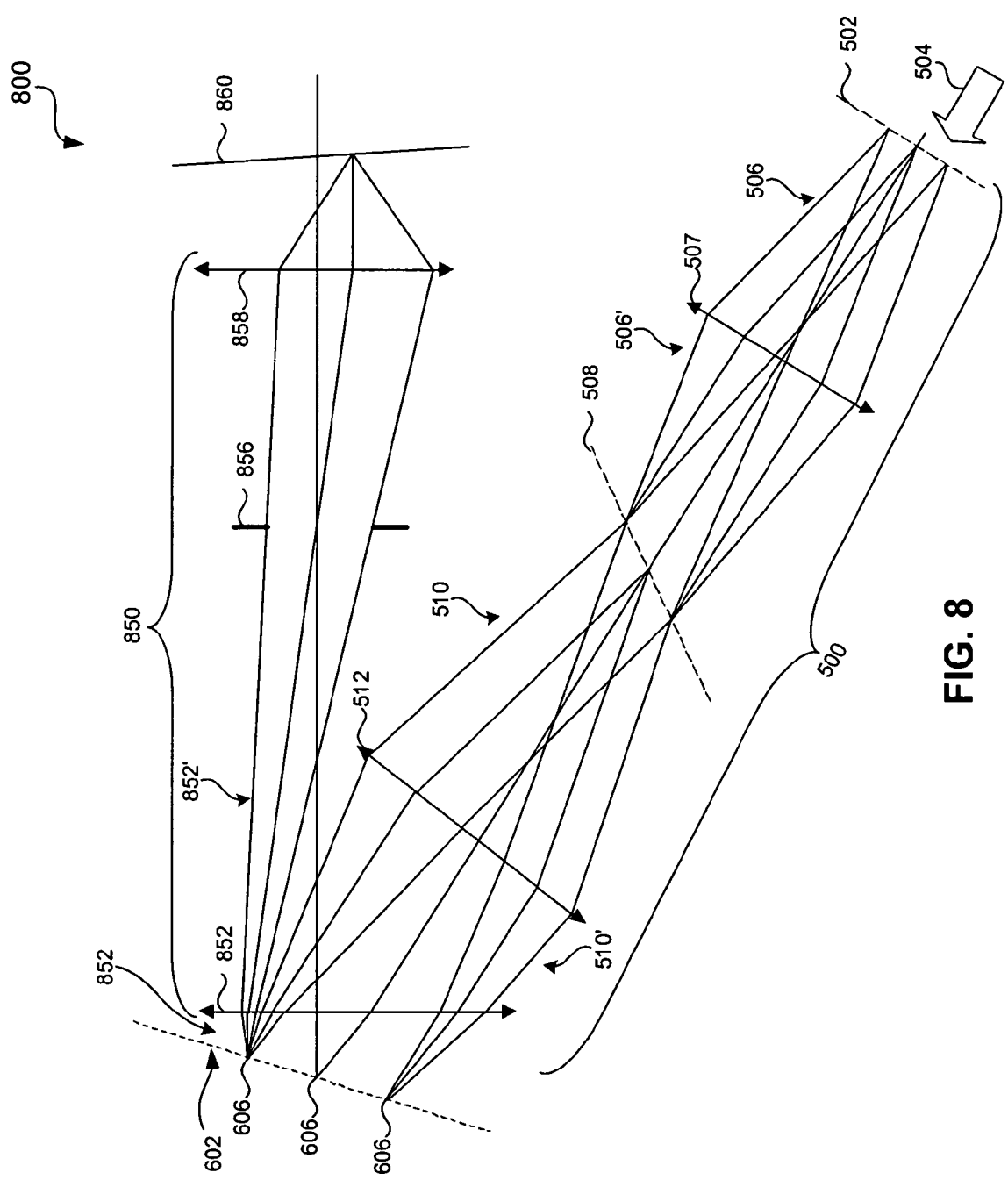
FIG. 8 shows an exemplary system using an illumination system according to an embodiment of the present invention.

FIG. 8 shows an exemplary lithography system 800 (e.g., a reticle or maskless lithography system) that includes illumination optics 500 and projection optics 850 according to an embodiment of the present invention. Light 504 from a light source (not shown) is shaped using PDE 502 to form shaped beams 506. Shaped beams 506 are focused onto FDE 508 using optical device 507 (e.g., a converging lens, or the like). Directed beams 510 are formed from FDE 508 and are focused onto desired illumination areas 606 of pattern generator 602 using optical device 512 (e.g., a converging lens, or the like). Reflected light beams 852 are directed using an optical device 854 as beams 852' through an aperture 856. The light beams 852' are then focused using optical device 858 onto a substrate 860 (e.g., a wafer, flat panel display, or any object that can retain a received pattern) to pattern a photosensitive surface of substrate 860.

It is to be appreciated that although a reflective pattern generator 602 is shown, a transmissive pattern generator can also be used, as would be apparent to one of ordinary skill in the art upon reading this description.

In one embodiments, uniformity of illumination within a pattern generator and between pattern generators in an array of pattern generators can be set using pattern generator calibration systems and methods.

In another embodiment, an FDE can be configured to balance relative dose from pattern generator to pattern generator in an array. For example, a series of filters (e.g., neutral density filters) down stream of the FDE can be used to balance relative dose from one pattern generator to another pattern generator.

In an embodiment performing stitching of pattern generator images, a rolloff profile may be required. In one example, the rolloff profile is generated with an FDE. In another example, the rolloff profile is generated prior to the FDE and the FDE is used to reproduce the rolloff profile.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system comprising
   a light source;
   a pupil defining element (PDE);
   a field defining element (FDE);
   an optical system; and
   a pattern generator,
   wherein light emitted from said light source is transmitted through said PDE, said FDE, and said optical system to form illumination spots that substantially impinge only on desired illumination areas of the pattern generator and are substantially directed away from undesired areas of said pattern generator.

2. The system of claim 1, wherein said FDE is positioned closer to said pattern generator than said PDE.

3. The system of claim 1, wherein said PDE is positioned closer to said pattern generator device than said FDE.

4. The system of claim 1, wherein said FDE and PDE are refractive devices.

5. The system of claim 1, wherein said FDE and said PDE are diffractive devices.

6. The system of claim 1, wherein said optical system comprises:
   a first optical element positioned after FDE; and
   a second optical element positioned after said PDE.

7. The system of claim 1, wherein said pattern generator comprises one or more reflective pattern generating devices.

8. The system of claim 1, wherein said pattern generator comprises one or more liquid crystal display (LCD) devices.

9. The system of claim 1, wherein said pattern generator comprises one or more digital mirror devices (DMD).

10. The system of claim 1, wherein said pattern generator comprises one or more grating light valve devices.

11. The system of claim 1, wherein said pattern generator comprises one or more reticles.

12. The system of claim 1, wherein said pattern generator comprises one or more transmissive pattern generator devices.

13. The system of claim 1, wherein said pattern generator comprises one or more spatial light modulator (SLM) devices.

14. The system of claim 1, further comprising:
   a light uniformity producing element positioned after the light source.

15. The system of claim 14, wherein the light uniformity producing element is one of a diffractive element and a refractive element.

16. The system of claim 1, wherein the PDE comprises one or more PDEs.

17. The system of claim 1, wherein the FDE comprises one or more FDEs.

18. A method comprising:
   transmitting light through a PDE and a FDE to form beams of light;
   directing said beams of light towards a pattern generator; and
   illuminating substantially only desired illumination areas and avoiding undesired areas of said pattern generator based on said transmitting and directing steps.

19. The method of claim 18, wherein said transmitting step comprises forming diffracted light as said beams of light using said FDE and said PDE.

20. The method of claim 18, further comprising:
   patterning a substrate with light that reflects from the desired illumination areas.

21. The method of claim 18, further comprising:
   patterning a substrate with light that transmits through the desired illumination areas.

22. The method of claim 18, further comprising using one of a reticle or a contrast device as the pattern generator.

23. The method of claim 18, further comprising:
   using a uniform beam profiler to produce light having a uniform beam profile as the light is transmitted through the PDE and the FDE.

* * * * *